United States Patent
Arya et al.

(10) Patent No.: US 9,043,174 B2
(45) Date of Patent: *May 26, 2015

(54) ESTIMATING LOSS RATES OF LINKS IN SMART GRIDS

(75) Inventors: Vijay Arya, Bangalore (IN); Balakrishnan Narayanaswamy, Karnataka (IN)

(73) Assignee: International Business Machines Corporation, Armonk, NY (US)

( * ) Notice: Subject to any disclaimer, the term of this patent is extended or adjusted under 35 U.S.C. 154(b) by 160 days.

This patent is subject to a terminal disclaimer.

(21) Appl. No.: 13/587,014

(22) Filed: Aug. 16, 2012

(65) Prior Publication Data

US 2013/0297241 A1    Nov. 7, 2013

Related U.S. Application Data

(63) Continuation of application No. 13/462,204, filed on May 2, 2012.

(51) Int. Cl.
| | |
|---|---|
| *G01R 21/00* | (2006.01) |
| *H02J 3/00* | (2006.01) |
| *G01R 21/133* | (2006.01) |
| *G01R 22/00* | (2006.01) |

(52) U.S. Cl.
CPC .................. *H02J 3/00* (2013.01); *G01R 21/133* (2013.01); *G01R 22/00* (2013.01)

(58) Field of Classification Search
USPC .......................................................... 702/61
See application file for complete search history.

(56) References Cited

U.S. PATENT DOCUMENTS

| | | |
|---|---|---|
| 7,106,044 B1 | 9/2006 | Lee, Jr. et al. |
| 2007/0238362 A1* | 10/2007 | Newman et al. ......... 439/620.24 |
| 2008/0109387 A1 | 5/2008 | Deaver et al. |
| 2010/0007336 A1 | 1/2010 | de Buda |

(Continued)

FOREIGN PATENT DOCUMENTS

| | | |
|---|---|---|
| WO | 2009135940 A2 | 11/2009 |
| WO | 2011156914 A2 | 12/2011 |

OTHER PUBLICATIONS

Echelon, Loss and Theft Detection Solutions, http://www.echelon.com/solutions/smartmetering/loss_theft_detection.htm, downloaded Dec. 23, 2011, pp. 1.

(Continued)

*Primary Examiner* — Aditya Bhat
(74) *Attorney, Agent, or Firm* — Ryan, Mason & Lewis, LLP

(57) ABSTRACT

A method for estimating loss rates of links in a smart grid includes identifying end-to-end passage rates from a source to each of multiple receiver and/or load meters in a smart grid, and estimating a loss in at least one link of the grid by identifying the sparsest solution of link loss rates that matches the end-to-end passage rates. Also, a system includes a memory, a processor coupled thereto, and software modules executing on the processor, including a monitoring module for monitoring power flow of receiver and/or load meters in a smart grid, a measurement collector module for collecting measurements to compute end-to-end passage rates from a source to each receiver and/or load meter, and a processing module for estimating a loss in a link of the grid by identifying the sparsest solution of link loss rates matching the end-to-end passage rates.

11 Claims, 4 Drawing Sheets

(56) References Cited

U.S. PATENT DOCUMENTS

2010/0217550 A1* 8/2010 Crabtree et al. ............... 702/62
2011/0270454 A1* 11/2011 Kreiss et al. ............... 700/291

OTHER PUBLICATIONS

Accenture, Achieving High Performance with Theft Analytics, http://www.accenture.com/SiteCollectionDocuments/PDF/Accenture-Achieving-High-Performance-with-Theft-Analytics.pdf, 2011, pp. 1-20.

Tenti et al., Distribution Loss Minimization by Token Ring Control of Power Electronic Interfaces in Residential Micro-Grids. 2010 IEEE International Symposium on Industrial Electronics, Jul. 4-7, 2010, pp. 2377-2381.

Electrical Power Research Institute Technical Report, Estimating the Costs and Benefits of the Smart Grid, 2011, pp. 1-162.

Singh, Analysis of Non-Technical Losses and its Economic Consequences on Power System, Jun. 2009, http://dspace.thapar.edu:8080/dspace/bitstream/10266/911/1/T, pp. 1-89.

* cited by examiner

ESTIMATING LOSS RATES OF LINKS IN SMART GRIDS

CROSS-REFERENCE TO RELATED APPLICATIONS

This application is a continuation of U.S. patent application Ser. No. 13/462,204, filed May 2, 2012, incorporated by reference herein.

FIELD OF THE INVENTION

Embodiments of the invention generally relate to information technology, and, more particularly, to power management.

BACKGROUND

Challenges arise from line losses and pilferage in smart grids. Large system losses can also be due to old or defective infrastructure. In general, a system designer will have some information about the possible location and quantities of these losses due to system knowledge, external measurements and/or historical data. However, a need exists for determining line losses and pilferage in smart grids given power-flow information.

SUMMARY

In one aspect of the present invention, techniques for estimating loss rates of links in smart grids are provided. An exemplary computer-implemented method for estimating loss rates of links in a smart grid can include steps of identifying end-to-end passage rates from a source to each of multiple receiver and/or load meters in a smart grid, and estimating a loss in at least one link of the smart grid by identifying the sparsest solution of link loss rates that matches the end-to-end passage rates.

Another aspect of the invention includes a system that includes a memory, at least one processor coupled to the memory, and at least one distinct software module, each distinct software module being embodied on a tangible computer-readable medium, the at least one distinct software module including a monitoring module, executing on the processor, for monitoring power flow of multiple receiver and/or load meters in a smart grid, a measurement collector module, executing on the processor, for interfacing with the monitoring module to collect measurements to compute end-to-end passage rates from a source to each receiver and/or load meter in the smart grid, and a processing module, executing on the processor, for estimating a loss in at least one link of the smart grid by identifying the sparsest solution of link loss rates that matches the end-to-end passage rates.

Another aspect of the invention or elements thereof can be implemented in the form of an article of manufacture tangibly embodying computer readable instructions which, when implemented, cause a computer to carry out a plurality of method steps, as described herein. Furthermore, another aspect of the invention or elements thereof can be implemented in the form of an apparatus including a memory and at least one processor that is coupled to the memory and operative to perform noted method steps.

Yet further, another aspect of the invention or elements thereof can be implemented in the form of means for carrying out the method steps described herein, or elements thereof; the means can include (i) hardware module(s), (ii) software module(s), or (iii) a combination of hardware and software modules; any of (i)-(iii) implement the specific techniques set forth herein, and the software modules are stored in a tangible computer-readable storage medium (or multiple such media).

These and other objects, features and advantages of the present invention will become apparent from the following detailed description of illustrative embodiments thereof, which is to be read in connection with the accompanying drawings.

DETAILED DESCRIPTION

As described herein, an aspect of the present invention includes estimating line losses and pilferage in smart grids given power-flow measurements (for example, from a feeder line at a substation and smart meters at homes). At least one embodiment of the invention does not require measurements or sensors at intermediate links. Such an arrangement can result in a substantially reduced number of meters when compared to existing approaches. The techniques described herein also include handling noise as well as missing and mis-calibrated data, which represent problem areas when dealing with smart meter data.

As described herein, at least one embodiment of the invention includes using a time series of distributed end-to-end power flow measurements over a tree to recursively infer line losses in intermediate links. Accordingly, aspects of the invention include, for example, identifying links and locations with losses, determining loss fractions on different links, and outputting a set of possible solutions.

In at least one embodiment of the invention, electricity distribution systems are tree shaped (that is, one source for many loads). This can require one measurement sensor per node in the tree. As detailed herein, embodiments of the invention can be carried out even when intermediate meters are missing and/or not available. By way of example, in the case of one meter at the source and meters at the loads and no intermediate measurements, an example embodiment of the invention can estimate line losses on each link. As noted, an aspect of the invention also includes estimating losses when measurements are noisy or when sensors malfunction.

Figure 1:
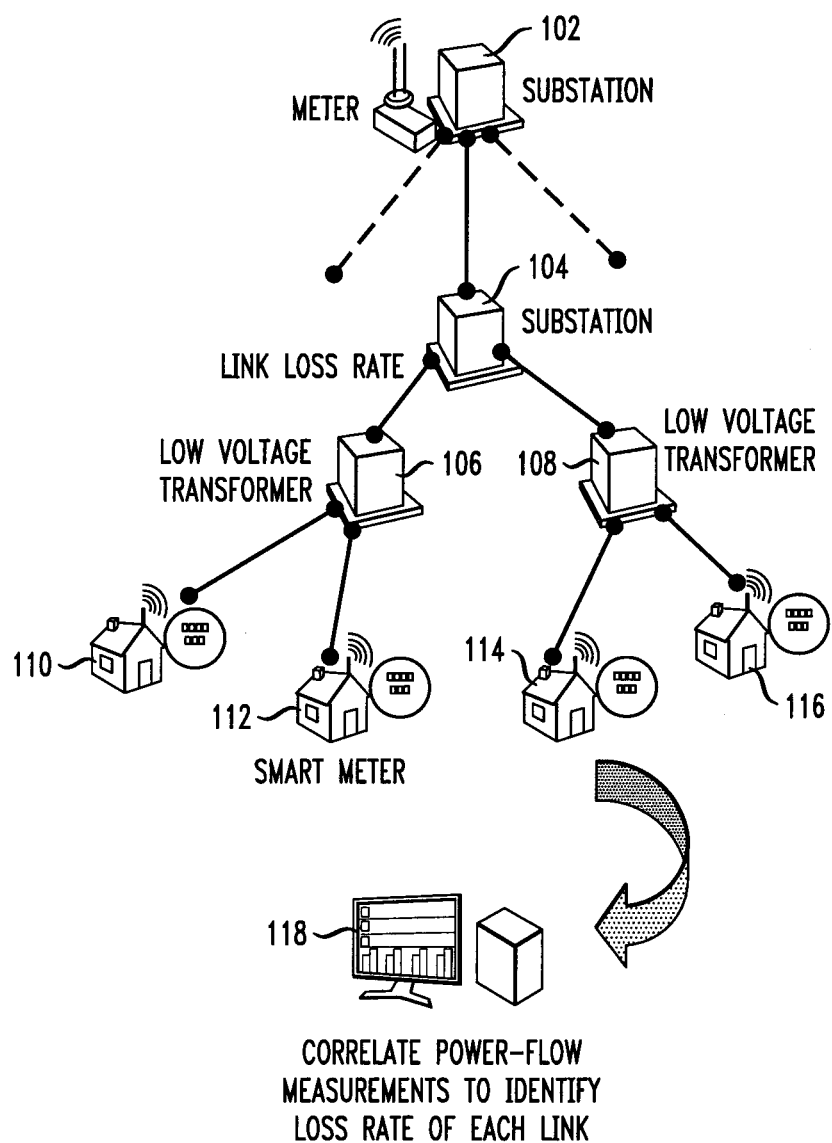
FIG. 1 is a diagram illustrating an example system, according to an embodiment of the present invention.

FIG. 1 is a diagram illustrating an example system, according to an embodiment of the present invention. By way of illustration, FIG. 1 depicts a substation 102 with a meter, a substation 104, low voltage transformers 106 and 108, structures (with smart meters) 110, 112, 114 and 116, and a power-flow measurement component 118 that correlates power-flow measurements to identify the loss rate of each link of the system.

As depicted in FIG. 1, and in an example embodiment of the invention, data flows from the meters at the root of a tree 102 and the leaves of the tree 110, 112, 114, and 116 to a processing location 118. There can be, for example, multiple processing locations that collect subsets of the measurements. Also, the data can flow, for example, in a multi-hop manner between meters and through intermediate repeater nodes if such components are present. In at least one embodiment of the invention, data can also flow from any available intermediate meters at intermediate nodes 104, 106, 108 (if they are present) to the processing center(s).

As described herein, an example system such as depicted in FIG. 1 uses a time series of end-to-end power-flow measurements for common time intervals at the source and leaf nodes in order to estimate loss rates of links in the underlying tree. The system can tolerate different forms of errors of different amounts, such as synchronization errors, variance of loss rates across measurements, etc. Measurements are used to setup a system of linear equations based on the principle of conservation of power-flow. Loss rates of links are retrieved recursively top-down through the tree, each iteration solving a different set of linear equations.

By way of example, consider the scenario of a grid to one or more homes (such as depicted in FIG. 1). Such a system includes a source meter at a substation and smart meters at a home(s), enabling the system to estimate the loss rate of each link in the underlying tree. Within a grid, there can be a source meter at a high-level substation, and leaf meters at descendant substations.

As detailed herein, at least one embodiment of the invention includes the steps of identifying the end-to-end passage/loss rates from a source to each receiver meter, and using end-to-end passage rates to identify losses/theft in intermediate parts of the tree.

Figure 2:
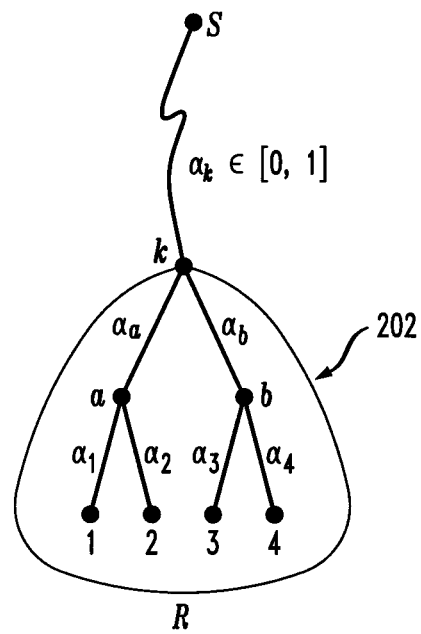
FIG. 2 is a diagram illustrating an example tree, according to an embodiment of the present invention.

FIG. 2 is a diagram 202 illustrating an example tree, according to an embodiment of the present invention. Specifically, FIG. 2 is a graphical illustration of the distribution tree depicted in FIG. 1. In FIG. 2, S corresponds to the root of the tree 102 in FIG. 1, and components 1, 2, 3 and 4 in FIG. 2 are the leaf nodes 110, 112, 114, 116 in FIG. 1. The alpha α variables are algebraic notation for the pass through rates of each link in the tree.

As noted above, an aspect of the invention includes identifying the end-to-end passage/loss rates from a source to each receiver meter. Accordingly, for example, consider the following problem and solution. Problem inputs can include a series of power-flow measurements at the source node S and each leaf meter r:

$$\{y_s^t\}, \{y_r^t\} \forall r \in R.$$

An objective includes determining the passage rates $p_r$ from S to each receiver meter r. For example:
$\alpha_k$=passage rate of path link not path Sk (passage rate=1−loss rate)
p variables correspond to passage rates of each path, including a sequence of links.
$p_1 = \alpha_k \alpha_a \alpha_1$, $p_2 = \alpha_k \alpha_a \alpha_2$, $p_3 = \alpha_k \alpha_b \alpha_3$, $p_4 = \alpha_k \alpha_b \alpha_4$.
Recovery of $p_1, p_2, p_3, p_4$:

$$\frac{y_1^t}{p_1} + \frac{y_2^t}{p_2} + \frac{y_3^t}{p_3} + \frac{y_4^t}{p_4} = y_s^t \quad \text{(Conservation Equation)}$$

Additionally, each y variable corresponds to the meter reading at a particular time and location. For example, $y_1^t$ corresponds to the meter reading at the first smart meter (for instance, component 110 in FIG. 1) at time t. $y_s^t$ corresponds to reading at the top of the tree (for instance, component 102 in FIG. 1).

Therefore, using |R| independent measurements, an example embodiment of the invention can include retrieving $p_1, p_2, p_3, p_4$.

Errors may arise, for instance, due to relay grade meters or supervisory control and data acquisition (SCADA) systems that do not support accurate power-flow measurements. Additionally, errors may arise due to smart meters that report erroneous measurements, or loss rates of paths that exhibit some variance across measurements. However, in the presence of errors, the noted conservation equation holds. Accordingly, at least one embodiment of the invention includes retrieving the solution that minimizes the norm of the error vector:

$$L2 \text{ minimization } \min_{\Theta} \|Y_r \Theta - Y_s\|_2$$
$$\Theta = \left[\frac{1}{p_1}, \frac{1}{p_2}, \dots \right]$$
$$Y_r = \lfloor y_1^t, y_2^t, \dots \rfloor$$
$$Y_s = \lfloor y_s^t \rfloor$$

The variable Y is a vector notation including all smart meter readings (for example, components 110, 112, 114 and 116 in FIG. 1) at a particular time instant.

Given sufficient measurements, mean loss rates of all paths can be recovered. If the pass-through rates α and p in the above do not change from time instant to time instant, then, given a sufficient number of measurements, at least one embodiment of the invention can provide the exact values of these pass-through rates. However, if the pass-through rates vary over time (for example, because of ambient situations, changes in demand or other reasons), the above equations estimate the average pass-through rates via the average of the values each pass-through value can take. Suppose, for example, an above-noted example embodiment of the invention can return an estimate of the average pass through rate $(1/T)*(\alpha_1^{t=1} + \alpha_1^{t=2} + \dots + \alpha_1^{t=T})$.

Equivalently, L1 minimization can also be used:

$$\min_{\Theta} \|Y_r \Theta - Y_s\|_1$$

Additionally, witness meters can be used to check the case of excessive errors by faulty meters. As used herein, a witness meter corresponds to any meter that is known to be correct or to have a low error rate or to be un-tampered. Such meters can include, for example, meters installed in low-risk locations or recently checked meters. Also, in at least one embodiment of the invention, such meters are known through some external process to be reliable. Further, in at least one embodiment of the invention, a portion of the meters can be instrumented such that:

(a) the utility trusts these meters and uses them, for example, for trusted customers, street lights, and/or traffic lights; and (b) the distance of the leaf meters from the source meter can be used to estimate an approximate loss rate of the path from the source meter to the leaf meter.

When an example embodiment of the invention computes loss/passage rates for all paths, the solution for good meters can be compared against their known passage rates to determine if there are any faulty meters in the system. As used herein, "good" meters are similar to witness meters but may be held to a lower standard of reliability. Additionally, measurements from different times of the day and/or week (peak hours, off-peak hours, etc.) can be checked, and, in at least one embodiment of the invention, only accurate path measurements are used.

When additional meters are available at intermediate nodes in a tree, one of the following methods can be used by an embodiment of the invention:

(a) the tree is broken into multiple sub-trees and passage rates are separately computed; or (b) new equations corresponding to intermediate meters are provided and used, and passage rates of all paths together are jointly estimated.

With respect to (a) above, the tree is broken down based on the location of the intermediate smart meters. If a meter at an intermediate location is reliable, the equations can be solved separately for the portion of the tree below this meter, treating that meter as the source or root for the new tree and separately for the rest of the tree. By way of example, in FIG. 1, if there is such an intermediate meter at 108, components 108, 114 and 116 can be broken up as a separate tree.

Accordingly, in addition to the original equation:

$$\frac{y_1^t}{p_1} + \frac{y_2^t}{p_2} + \frac{y_3^t}{p_3} + \frac{y_4^t}{p_4} = y_s^t,$$

the following equation is used:

$$\frac{y_1^t}{p_1} + \frac{y_2^t}{p_2} + \frac{y_b^t}{p_b} = y_s^t$$

where $p_b = \alpha_k \alpha_b$, and $$\frac{y_3^t}{\alpha_3} + \frac{y_4^t}{\alpha_4} = y_b^t.$$

Figure 3:
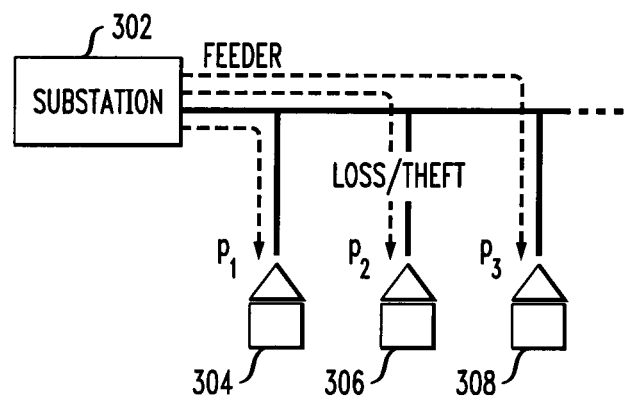
FIG. 3 is a diagram illustrating an example scenario, according to an embodiment of the present invention.

FIG. 3 is a diagram illustrating an example scenario, according to an embodiment of the present invention. By way of illustration, FIG. 3 depicts a substation 302 feeding power to homes/structures 304 ($p_1$), 306 ($p_2$) and 308 ($p_3$). If there is fault at $p_2$ (merely an example in the FIG. 3 depiction), its estimated loss would be much higher than path $p_3$, though it is closer. Essentially, what is being illustrated in FIG. 3 is a process of anomaly detection, where any prior knowledge of expected loss rates along links or paths is used to localize particularly faulty links or paths. Such prior information can include, for example, knowledge of materials and types of transformers, links, cables, ambient conditions and SCADA measurements of loads and supply.

In at least one embodiment of the invention, loss and/or theft can be detected by correlating knowledge of distance and/or topology. By way of example, under normal conditions, meters closer to the substation may have better passage rates than meters that are further away from the substation. On the other hand, with loss and/or theft, this condition may be violated and can be used to identify locations of loss and/or theft.

Accordingly, consider, under normal conditions: $P_1 > P_2 > P_3$. However, by way of example, as depicted in FIG. 3, with sufficient loss and/or theft at the second structure: $P_1 > P_2 < P_3$.

Additionally, consider a scenario where a few links in the system have high losses due to loss and/or theft or inefficiencies. At least one embodiment of the invention can include retrieving the sparsest solution that matches the observed end-to-end path passage rates (obtained as described herein). The sparsest solution can be retrieved using several known methods. According to at least one embodiment of the invention, finding the sparsest solution is a combinatorial problem that can be solved by enumeration or listing all possible combinations of lossy links and solving for their values. However, this may be computationally expensive, so at least one embodiment of the invention includes solving approximate versions of this problem (quadratic and linear programs detailed herein). These problems belong to a class of problems referred to herein as convex problems for which methods and tools exist, such as interior point methods.

Further, locations of losses can be identified based on the end-to-end passage/loss rates from the source to each receiver meter. All losses can be identified, but in at least one embodiment of the invention, high losses are targeted and identified more reliably, possibly from fewer measurements. By way of example, for such a scenario, problem inputs can include the path passage rates $p_r$ (possibly with error) from source S to each receiver meter r and the tree topology. The determined output includes the locations of high loss rates or passage $\alpha_k$ for each link k. Accordingly:

$p_1 = \alpha_k \alpha_a \alpha_1$ passage$\in[0,1] \Rightarrow -\lg(\text{passage}) \in [0,\infty]$
$-\lg(p_1) = -\lg(\alpha_k) - \lg(\alpha_a) - \lg(\alpha_1)$   passage=1(loss=0)$\Rightarrow -\lg$(passage)=0

Additionally, at least one embodiment of the invention includes solving L2-L1 (quadratic program):

$$\min_\Theta \|A\Theta - P\|_2 + \lambda \|\Theta\|_1$$

$$\Theta \geq 0$$

where:
$\Theta = [-\lg(\alpha_1), -\lg(\alpha_2), \ldots]$, $P = [-\lg(p_1), -\lg(p_2), \ldots]^T$, and A=a binary matrix that represents the tree topology A(i, j)=1 if the $i^{th}$ receiver path contains link j; 0 otherwise.

Also, at least one embodiment of the invention includes solving L1-L1 (linear program):

$$\min_\Theta \|A\Theta - P\|_1 + \lambda \|\Theta\|_1$$

$$\Theta \geq 0.$$

Figure 4:
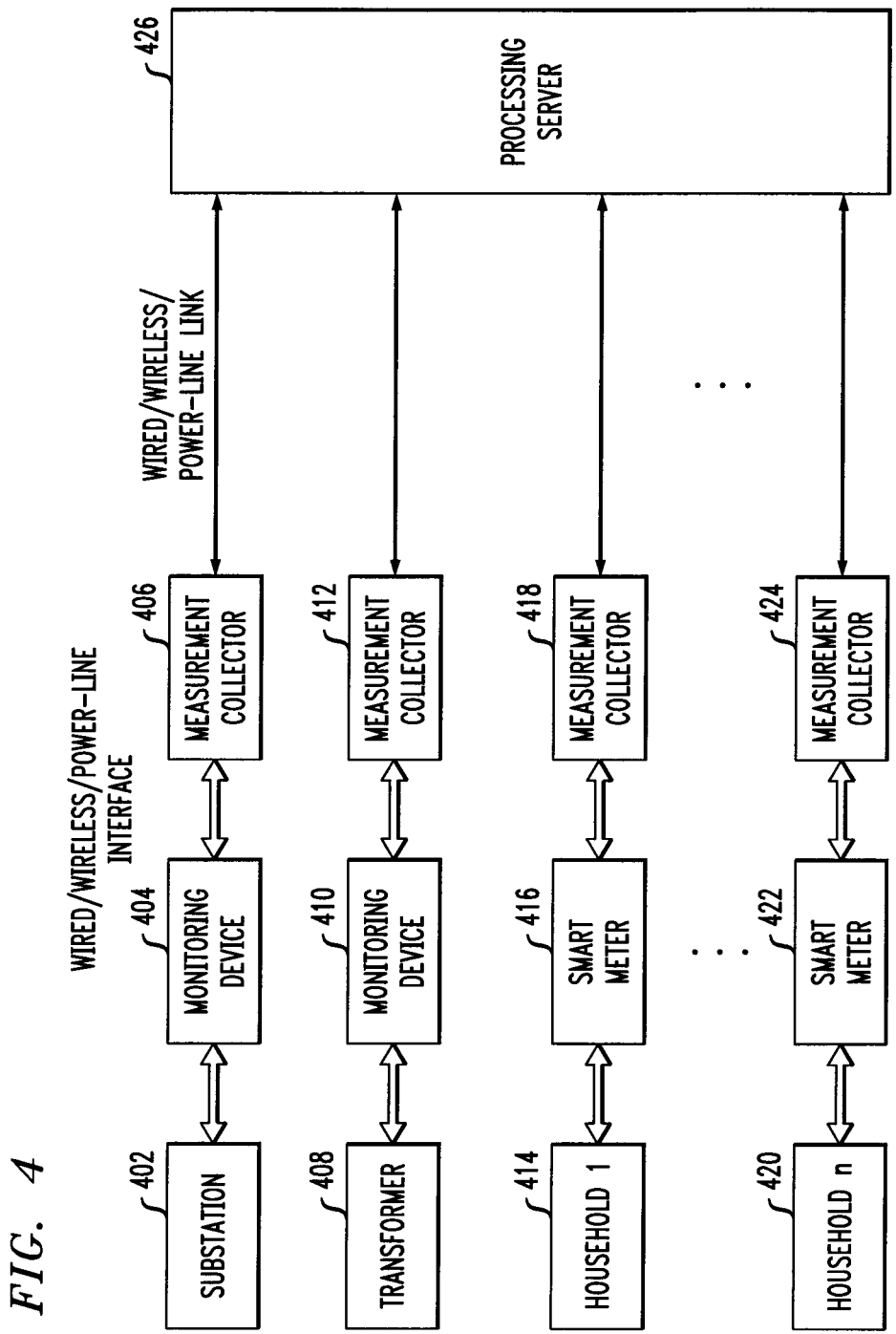
FIG. 4 is a diagram illustrating example architecture, according to an embodiment of the present invention.

FIG. 4 is a diagram illustrating example architecture, according to an embodiment of the present invention. By way of illustration, FIG. 4 depicts substation 402, which interacts with monitoring device 404, which interacts with measurement collector 406. Additionally, transformer 408 interacts with monitoring device 410, which interacts with measurement collector 412. Further, households 414 and 420 interact with smart meters 416 and 422, respectively, which interact with measurement collectors 418 and 424, respectively. Also, measurement collectors 406, 412, 418 and 424 interact (for example, via a wired, wireless, or power line link) with processing server 426.

The flow data depicted in FIG. 4 is similar to the flow described above in accordance with at least one embodiment of the invention. The monitoring devices and smart meters collect measurements from substations, household consumption and possibly any intermediate transformers. Such measurements are collected, stored and/or processed at intermediate locations for cost or efficiency reasons and then processed at one or more central locations.

Figure 5:
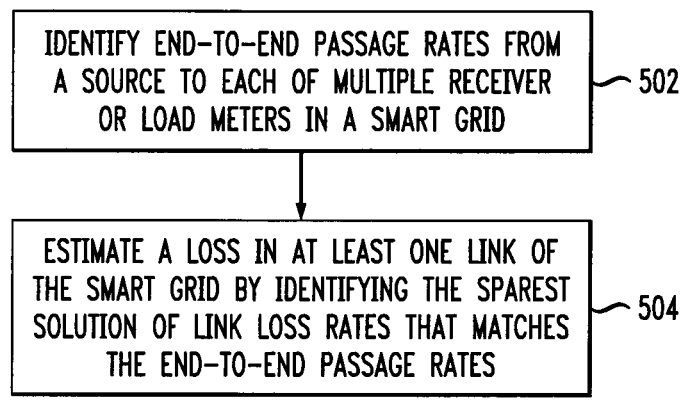
FIG. 5 is a flow diagram illustrating techniques for estimating loss rates of links in a smart grid, according to an embodiment of the invention.

FIG. 5 is a flow diagram illustrating techniques for estimating loss rates of links in a smart grid, according to an embodiment of the present invention. Step 502 includes identifying end-to-end passage rates from a source to each of multiple receiver and/or load meters in a smart grid. Identifying end-to-end passage rates can include interfacing with at least one monitoring device of at least one of a substation, a transformer, and a residential smart meter. Additionally, identifying end-to-end passage rates can include using a time series of end-to-end power-flow measurements for common time intervals at the source and receiver meters in a smart grid. Further, at least one embodiment of the invention includes collecting periodic synchronous measurements to compute a power-flow for each of multiple time intervals.

Additionally, as described herein, at least one embodiment of the invention includes identifying end-to-end passage rates using a system of linear equations.

Step 504 includes estimating a loss in at least one link of the smart grid by identifying the sparsest solution of link loss rates that matches the end-to-end passage rates. The techniques depicted in FIG. 5 can additionally include using knowledge of distance of meters from the source and topology of the smart grid to identify a location of a link with a high loss. Additionally, the link loss rates can be used to identify a location of a link with a high loss. The techniques depicted in FIG. 5 can further include ranking links according to loss.

Further, as described herein, at least one embodiment of the invention can include identifying likely values of loss on multiple links based on prior information about loss rates. Such prior information can include, for example, materials used, age of materials, ambient conditions, etc.

As also detailed herein, at least one embodiment of the invention can include using meters at a subset of the links in the smart grid, and sending end-to-end loss rate measurement messages to a server for processing. Further, the techniques depicted in FIG. 5 can include continuously monitoring total power losses occurring on each link in the smart grid.

The techniques depicted in FIG. 5 can also, as described herein, include providing a system, wherein the system includes distinct software modules, each of the distinct software modules being embodied on a tangible computer-readable recordable storage medium. All of the modules (or any subset thereof) can be on the same medium, or each can be on a different medium, for example. The modules can include any or all of the components shown in the figures. In an aspect of the invention, the modules can run, for example, on a hardware processor. The method steps can then be carried out using the distinct software modules of the system, as described above, executing on a hardware processor. Further, a computer program product can include a tangible computer-readable recordable storage medium with code adapted to be executed to carry out at least one method step described herein, including the provision of the system with the distinct software modules.

Additionally, the techniques depicted in FIG. 5 can be implemented via a computer program product that can include computer useable program code that is stored in a computer readable storage medium in a data processing system, and wherein the computer useable program code was downloaded over a network from a remote data processing system. Also, in an aspect of the invention, the computer program product can include computer useable program code that is stored in a computer readable storage medium in a server data processing system, and wherein the computer useable program code is downloaded over a network to a remote data processing system for use in a computer readable storage medium with the remote system.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in a computer readable medium having computer readable program code embodied thereon.

An aspect of the invention or elements thereof can be implemented in the form of an apparatus including a memory and at least one processor that is coupled to the memory and operative to perform exemplary method steps.

Figure 6:
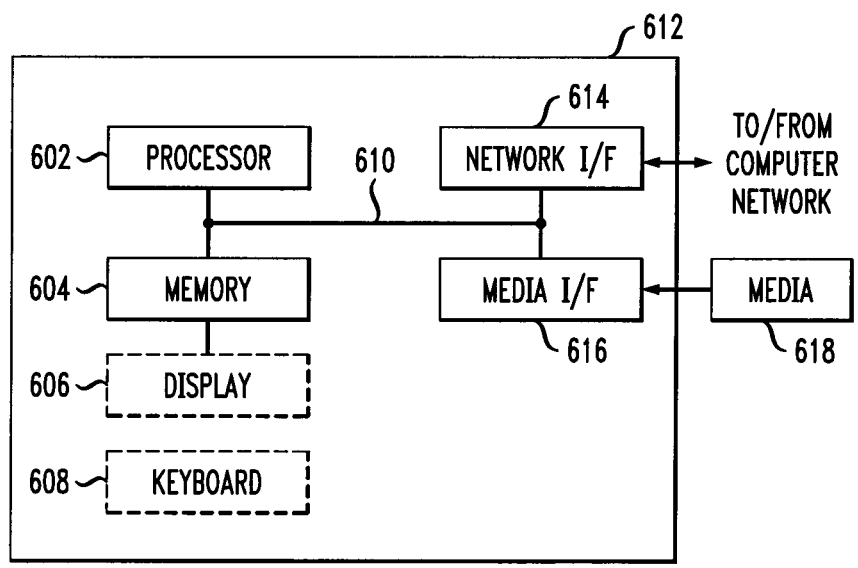
FIG. 6 is a system diagram of an exemplary computer system on which at least one embodiment of the invention can be implemented.

Additionally, an aspect of the present invention can make use of software running on a general purpose computer or workstation. With reference to FIG. 6, such an implementation might employ, for example, a processor 602, a memory 604, and an input/output interface formed, for example, by a display 606 and a keyboard 608. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, a mechanism for inputting data to the processing unit (for example, mouse), and a mechanism for providing results associated with the processing unit (for example, printer). The processor 602, memory 604, and input/output interface such as display 606 and keyboard 608 can be interconnected, for example, via bus 610 as part of a data processing unit 612. Suitable interconnections, for example via bus 610, can also be provided to a network interface 614, such as a network card, which can be provided to interface with a computer network, and to a media interface 616, such as a diskette or CD-ROM drive, which can be provided to interface with media 618.

Accordingly, computer software including instructions or code for performing the methodologies of the invention, as described herein, may be stored in associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 602 coupled directly or indirectly to memory elements 604 through a system bus 610. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 608, displays 606, pointing devices, and the like) can be coupled to the system either directly (such as via bus 610) or through intervening I/O controllers (omitted for clarity).

Network adapters such as network interface 614 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 612 as shown in FIG. 6) running a server program. It will be understood that such a physical server may or may not include a display and keyboard.

As noted, aspects of the present invention may take the form of a computer program product embodied in a computer readable medium having computer readable program code embodied thereon. Also, any combination of computer readable media may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of at least one programming language, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. Accordingly, an aspect of the invention includes an article of manufacture tangibly embodying computer readable instructions which, when implemented, cause a computer to carry out a plurality of method steps as described herein.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, component, segment, or portion of code, which comprises at least one executable instruction for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the components detailed herein. The method steps can then be carried out using the distinct software modules and/or sub-modules of the system, as described above, executing on a hardware processor 602. Further, a computer program product can include a computer-readable storage medium with code adapted to be implemented to carry out at least one method step described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, an appropriately programmed general purpose digital computer with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of another feature, integer, step, operation, element, component, and/or group thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

At least one aspect of the present invention may provide a beneficial effect such as, for example, estimating losses even when intermediate meters are missing and/or not available.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for estimating loss rates of links in a smart grid, the method comprising the following steps:
   identifying an end-to-end passage rate from a source to each of multiple receiver meters and/or load meters in a smart grid based on a time series of end-to-end power-flow measurements for common time intervals at the source and each of the multiple receiver meters and/or load meters in the smart grid;
   estimating a loss rate of each of multiple intermediate links of the smart grid between the source and each of the multiple receiver meters and/or load meters without utilization of measurements at the multiple intermediate links by identifying the sparsest solution of link loss rates that matches the end-to-end passage rates; and
   localizing a faulty link among the multiple intermediate links of the smart grid between the source and each of the multiple receiver meters and/or load meters based on a comparison of the estimated loss rate of each of the multiple links to an expected loss rate for each of the multiple intermediate links determined based on (i) materials used in the smart grid, (ii) distance of each of the multiple receiver meters and/or load meters from the source, (iii) topology of the smart grid, (iv) ambient conditions associated with the smart grid, and (v) measurements of loads and supply associated with the smart grid;
   wherein each of the steps is carried out by a computer device.

2. The method of claim 1, comprising identifying likely values of loss on multiple links based on prior information about loss rates.

3. The method of claim 2, wherein the prior information comprises at least one of materials used, age of materials and ambient conditions.

4. The method of claim 1, comprising using the link loss rates to identify a location of a link with a loss.

5. The method of claim 1, wherein said identifying comprises interfacing with at least one monitoring device of at least one of a substation, a transformer, and a residential smart meter.

6. The method of claim 1, wherein said identifying comprises collecting periodic synchronous measurements to compute a power-flow for each of multiple time intervals.

7. The method of claim 1, comprising ranking links according to loss.

8. The method of claim 1, comprising sending end-to-end loss rate measurement messages to a server for processing.

9. The method of claim 1, comprising using meters at a subset of the links in the smart grid.

10. The method of claim 1, wherein said identifying comprises using a system of at least one linear equation.

11. The method of claim 1, comprising continuously monitoring total power losses occurring on each link in the smart grid.

* * * * *